(12) United States Patent
Van Rumpt (10) Patent No.: US 7,299,018 B2
(45) Date of Patent: Nov. 20, 2007

(54) RECEIVER COMPRISING A DIGITALLY CONTROLLED CAPACITOR BANK

(75) Inventor: Herman Wouter Van Rumpt, s'Hertogenbosch (NL)

(73) Assignee: Semiconductor Ideas to Market (ITOM), Breda (NL)

( * ) Notice: Subject to any disclaimer, the term of this patent is extended or adjusted under 35 U.S.C. 154(b) by 940 days.

(21) Appl. No.: 10/333,668

(22) PCT Filed: Jul. 19, 2001

(86) PCT No.: PCT/EP01/08398

§ 371 (c)(1),
(2), (4) Date: Jun. 4, 2003

(87) PCT Pub. No.: WO02/09280

PCT Pub. Date: Jan. 31, 2002

(65) Prior Publication Data

US 2004/0041671 A1 Mar. 4, 2004

(30) Foreign Application Priority Data

Jul. 21, 2000 (EP) .................................. 00202622

(51) Int. Cl.
*H04B 1/18* (2006.01)
*H04B 1/28* (2006.01)
*H03H 5/12* (2006.01)

(52) U.S. Cl. .................. 455/150.1; 455/333; 334/15

(58) Field of Classification Search ............ 455/150.1, 455/150.4, 197.2, 197.3, 160.1, 179.1, 188.1, 455/197, 307, 333, 339; 334/15, 55; 327/264, 327/265

See application file for complete search history.

(56) References Cited

U.S. PATENT DOCUMENTS

| 4,216,451 | A | | 8/1980 | Nishimura et al. |
|---|---|---|---|---|
| 5,117,206 | A | * | 5/1992 | Imamura ..................... 331/158 |
| 5,880,921 | A | * | 3/1999 | Tham et al. .................. 334/55 |
| 5,889,486 | A | * | 3/1999 | Opris et al. ................. 341/150 |
| 5,952,952 | A | * | 9/1999 | Choi et al. .................. 341/172 |
| 5,973,633 | A | * | 10/1999 | Hester ......................... 341/172 |
| 6,281,761 | B1 | * | 8/2001 | Shin et al. ............. 331/116 FE |
| 6,285,866 | B1 | * | 9/2001 | Lee et al. .................... 455/333 |
| 6,417,727 | B1 | * | 7/2002 | Davis ......................... 327/553 |
| 2001/0002819 | A1 | * | 6/2001 | Ikeda ......................... 341/150 |

* cited by examiner

*Primary Examiner*—Quochien B. Vuong
(74) *Attorney, Agent, or Firm*—Robert M. McDermott, Esq.

(57) ABSTRACT

Receiver comprising an RF input filter including a digitally controlled capacitor bank with n capacitors being controlled by a tuning control signal for varying the tuning frequency of the RF input filter within a tuning range. For an improvement of the receiver in price/performance ratio the n capacitors of the digitally controlled capacitor bank are monolythically integrated, whereas the bandwidth of the tunable RF input filter is being adjusted to the maximum relative spread of said capacitors. A continuous tuning control signal is being supplied through an analogue to digital (AD) converter to said capacitor bank and to a first input of a differential stage, an output of the AD converter being coupled through a digital to analogue (DA) converter to a second input of a differential stage, an output of the differential stage being coupled to a control terminal of a variable capacitance diode being arranged in parallel to the digitally controlled capacitor bank.

37 Claims, 8 Drawing Sheets

RECEIVER COMPRISING A DIGITALLY CONTROLLED CAPACITOR BANK

The invention relates to a receiver comprising a tuning circuit including a digitally controlled capacitor bank with n capacitors being monolithically integrated in planary form and being controlled by a tuning control signal, as well as to a capacitor bank. A receiver using a digitally controlled capacitor bank of this type is known e.g. from U.S. Pat. No. 4,216,451.

The capacitor bank of the known receiver provides a variable capacitance, included in a filter circuit and is controlled to incrementally vary the tuning frequency of the filter and/or the receiver. The use of a capacitor bank instead of a single variable capacitance diode, allows to lower the bias voltage and to avoid the need for DC/DC converters. Furthermore, the n capacitors of the digitally controlled capacitor bank being monolithically integrated in planary form enable to optimise the above receiver and/or the capacitor bank used therein, in terms of price/performance ratio and in particular in tuning behaviour.

However, In practice, the component values of circuit elements implemented in planary technology and in particular in integrated circuit (IC) technology have absolute and relative spread. Absolute spread is understood to be the spread in the actual component values from a wanted or average value, whereas relative spread is understood to be the spread in the component values of the elements relative to each other. Absolute spread is mainly caused by variation of the thickness or the composition of planar layers, whereas relative spread is caused by the inhomogenities along the X and Y axes of the planar layers. Both types of spread cause the actual value of integrated elements to deviate unpredictably from a target value, which in particular for relatively small values of the capacitance may amount to 30% or more. This has prevented so far to integrate the capacitor bank for use in a receiver tuning circuit. The invention, however, is based on the recognition that in the above integrated capacitor bank, said spread can be prevented from affecting the accuracy of the capacitance value of the capacitor bank and/or the tuning frequency.

In consequence, amongst other things, it is an object of the invention is to minimise the overall spread of the capacitance value of the capacitor bank.

Now therefore, according to one of its aspects, the invention is characterised by said n capacitors providing various capacitance values including a unity capacitor covering a unity IC surface, wherein capacitors having capacitance values smaller than said unity capacitor cover respective IC surfaces, which in proportion to their value are smaller than said unity IC surface and wherein capacitors having capacitance values greater than said unity capacitor are being formed by clusters of capacitors, each covering an IC surface corresponding to said unity IC surface.

This measure is based on the recognition that the relative spread of an integrated element, and in particular an integrated capacitor increases with a decreasing IC surface thereof, whereas identical element structures decreases in relative spread with the square root of the multiplicity of application thereof. Said measure therewith allows by a proper choice of the unity capacitor to minimise the total spread in the capacitance value of the capacitor bank.

In a preferred embodiment of the invention said n capacitors form a binary weighted sequence of capacitance values ranging from $2^0$ to $2^{n-1}$, whereas said unity capacitor is chosen to correspond to a capacitance value $2^k$, k being larger than 1 and smaller than n.

In a further preferred embodiment of the invention n is in the order of magnitude of 10, whereas k is being chosen in a range between 3 and 8. By applying this measure optimal use is made of the IC surface dependent spread of the capacitors to obtain a minimum overall spread of the capacitance of the capacitor bank at each value within the tuning range.

Preferably said unity capacitor being chosen to define the upper boundary limit of the tuning range in compensation parasitic effects.

Furthermore the above composition of capacitors in clusters of unity capacitors introduces a degree of freedom in the lay out design to further minimise the overall spread in the individual integrated capacitors of the capacitor bank.

Another preferred embodiment of the invention is therefore characterised in that said clusters of unity capacitors are being surrounded by isolated dummy capacitors. This measure allows to compensate for spread in the capacitance values of the capacitors due to proximity effects.

To reduce parasitic effects, such receiver is preferably being characterised in that the capacitors of the capacitor bank are structured in lay out to form clusters having minimum parasitic wiring effects.

Another object of the invention is to improve and simplify the control of the capacitor bank.

Therefore, a receiver and/or capacitor bank comprising n capacitors being controlled by a (tuning) control signal, according to the invention is characterised by an AD converter for converting an analogue tuning control signal into an m bit binary signal being coupled to a bitnumber conversion device for converting said m bit binary signal into an n bit binary signal, m being smaller than n, said n bit binary signal including bits 1 to N respectively controlling capacitors 1 to n of the capacitor bank.

This measure is based on the recognition that the number of binary weighted capacitor values necessary to obtain an appropriate degree of accuracy in tuning frequencies is smaller than n, being the number of binary weighted capacitors of the capacitor bank needed to cover the tuning range. This measure allows to use an analogue tuning control signal for tuning the RF input filter and furthermore, to simplify the operation and implementation of the AD converter while maintaining an appropriate degree of accuracy in tuning frequencies.

A preferred embodiment of the invention is characterised in that the bitnumber conversion device comprises a look up table comprising m*n storage locations for storing therein an n bit binary signal for controlling the n capacitors of the integrated digitally controlled capacitor bank.

The bitnumber conversion device may alternatively comprise a microprocessor for executing an algorithm for converting an m bit binary signal into an n bit binary signal.

Preferably, the bitnumber conversion device comprise means for adjusting the dependency of capacitance variation of the integrated digitally controlled capacitor bank on the control signal e.g. to effect linear dependency between the tuning frequency and said control signal.

Another object of the invention is to adapt the control of the n capacitors of the capacitor bank to the actual spread in capacitor values.

A preferred embodiment of the invention is therefore characterised by a calibration circuit for measuring absolute spread in the capacitance values of the n capacitors of the integrated capacitor bank being coupled to the bitnumber conversion device to adapt said conversion to compensate for said absolute spread.

This measure provides for an elimination of the absolute spread from the tuning behaviour of the receiver and in particular the RF input filter thereof.

It is yet another object of the invention to improve receiver signal selection and processing.

An embodiment of a receiver according to the invention is therefore characterised by an RF input filter comprising a further capacitor bank being controlled by a control signal generator comprising means to provide parallel tracking of the tuning circuit and the RF filter.

Such means may include various look up tables each comprising m*n storage locations for storing therein the n bit binary signal controlling the n capacitors of the integrated digitally controlled capacitor bank, or may alternatively include means to execute an algorithm which performs the same task.

Another object of the invention is to avoid the discrete—or step wise—capacitance variation of the capacitor bank from becoming critical in some specific applications thereof. In particular when being applied in phase locked loops.

Therefore, a preferred embodiment of a receiver according to the invention is being characterised by a phase locked loop comprising a controllable oscillator, a continuous tuning control signal being supplied through an analogue to digital (AD) converter to said capacitor bank and to a first input of a differential stage, an output of the AD converter being coupled through a digital to analogue (DA) converter to a second input of a differential stage, an output of the differential stage being coupled to a control terminal of a variable capacitance diode being arranged in parallel to the capacitor bank.

This measure prevents the phase locked loop from repeated switching between two settings of the digitally controlled capacitor bank.

A variable capacitance device according to the invention for use in the last mentioned receiver is characterised by a continuous tuning control signal being supplied through an analogue to digital (AD) converter to a further capacitor bank and to a first input of a differential stage, an output of the AD converter being coupled through a digital to analogue (DA) converter to a second input of a differential stage, an output of the differential stage being coupled to a control terminal of a variable capacitance diode being arranged in parallel to the digitally controlled capacitor bank.

By applying these measures according to the invention, operation of the digitally controlled capacitor bank within a control range requires a much lower supply voltage than conventional variable capacitance diodes, whereas the variable capacitance diode included in the variable capacitance device according to the invention only needs to vary within a range corresponding to only one stepwidth of the capacitance increments of the digitally controlled capacitor bank.

Preferably, the capacitance variation range of the variable capacitance diode is chosen to correspond to the capacitance variation stepwidth of the capacitor bank at an incremental change of the output signal of the AD converter.

In a preferred embodiment of the invention, amplification means are used to adapt the difference between the original analogue control signal on the one hand and the digitised analogue control signal for the capacitor bank on the other hand to the available capacitance control range of the variable capacitance diode.

A further preferred embodiment of the invention allowing linear control of the variable capacitance diode within its capacitance variation range is characterised by the continuous control signal being supplied through said control input to a gain control input of the amplification means.

Another preferred embodiment of a variable capacitance device according to the invention, in which the effect of spread is further minimised, is characterised by including in a common housing first and second look up tables a common input thereof being supplied with a tuning control signal and outputs thereof being coupled to first and second monolithically integrated digitally controlled capacitor banks for the use thereof in first and second filter circuits, respectively, the first and second look up tables providing for parallel filter tracking.

The foregoing and other objects and advantages of the present invention will become more readily apparent from the following description of preferred embodiments, as taken in conjunction with the accompanying drawings, which are a part hereof and wherein.

Figure 1A:
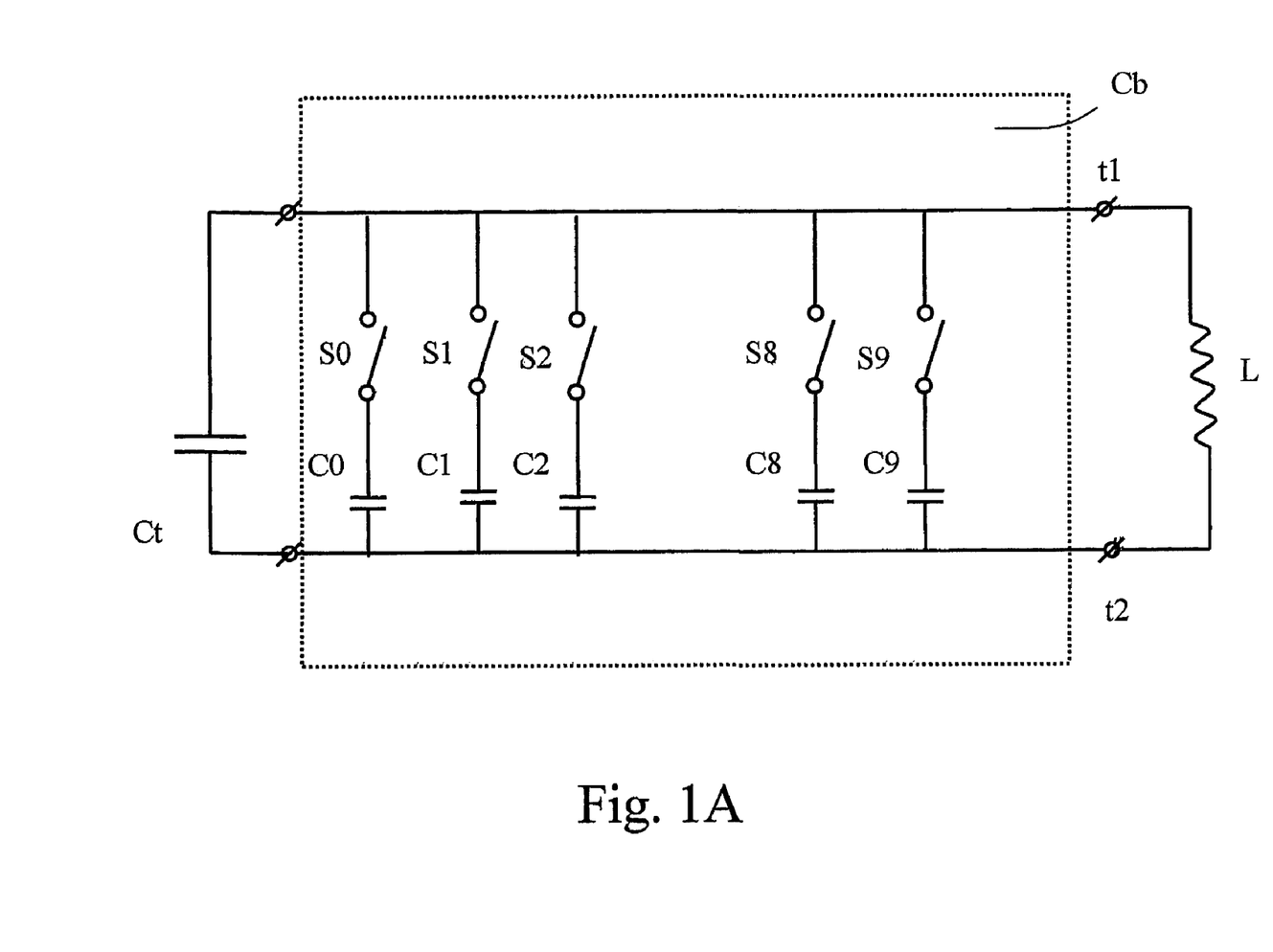
FIG. 1A is a functional diagram of a monolithically integrated digitally controlled capacitor bank according to the invention.

FIG. 1A shows a functional diagram of a monolithically integrated digitally controlled capacitor bank capacitor bank Cb according to the invention comprising n=10 capacitors C0-C9 forming a binary weighted sequence of values $2^0$ to $2^9$, which can be individually switched through respective switches S0-S9 between first and second terminals t1 and t2 under control of a digital 10 bit word. A trimmer capacitor Ct is connected in parallel to the capacitors C0-C9 between the first and second terminals t1 and t2. The trimmer capacitor Ct is to compensate for the unpredictable parasitic capacitances (inherent to the IC implementation and e.g. caused by bondings) and to bring the total capacitance occurring across the capacitor bank to a predetermined fixed value Cfix. In practice this fixed value Cfix is kept as small as possible. An inductor L is coupled in parallel between said first and second terminals t1 and t2 to form with the capacitors C0-C9 an LC tuning circuit being controlled in its tuning frequency over a certain frequency range, for example the AM radio broadcast frequency band ranging from 500 to 1500 Khz. Although in this example, 10 bits are actually required to cover the full tuning frequency range, the relative spread in component values of the capacitors C0-C9 cause the number of essential information carrying bits to be limited to at most 7 bits only. The accuracy in capacitance value obtainable with 7 bits amounts to approximately 1%, which more or less conforms to the accuracy obtainable in an integrated implementation. For small capacitance values the three most significant bits are always zero, i.e. switches S7-S9 are always open, whereas for large capacitance values the three least significant bits are always irrelevant as their value is less than said 1% spread. A 7 bits word can be used according to the invention to vary the capacitance of a capacitor bank with 10 capacitors within a receiver tuning range, by applying bit number conversion means to convert said 7 bits tuning control signal into a 10 bits tuning control signal for the capacitor bank. This allows to use a 7 bits AD converter for an analogue to digital conversion of a continuous tuning control signal.

The bit conversion can be carried out dynamically by using a trial and error calculation scheme. The bit conversion can alternatively be read out from a look up table in the given example using 10 bits read only memories addressed by the 7 bit words of the digital tuning control voltage. In addition to bit number conversion the look up table may also comprise data to provide for compensation of or for adjusting the dependency of capacitance variation of the digitally controlled capacitor bank on the tuning control signal to effect a linear dependency of the tuning frequency of the LC tuning circuit on said tuning control signal.

The function of such look up table will be explained in more detail with reference to FIG. 7.

Figure 1B:
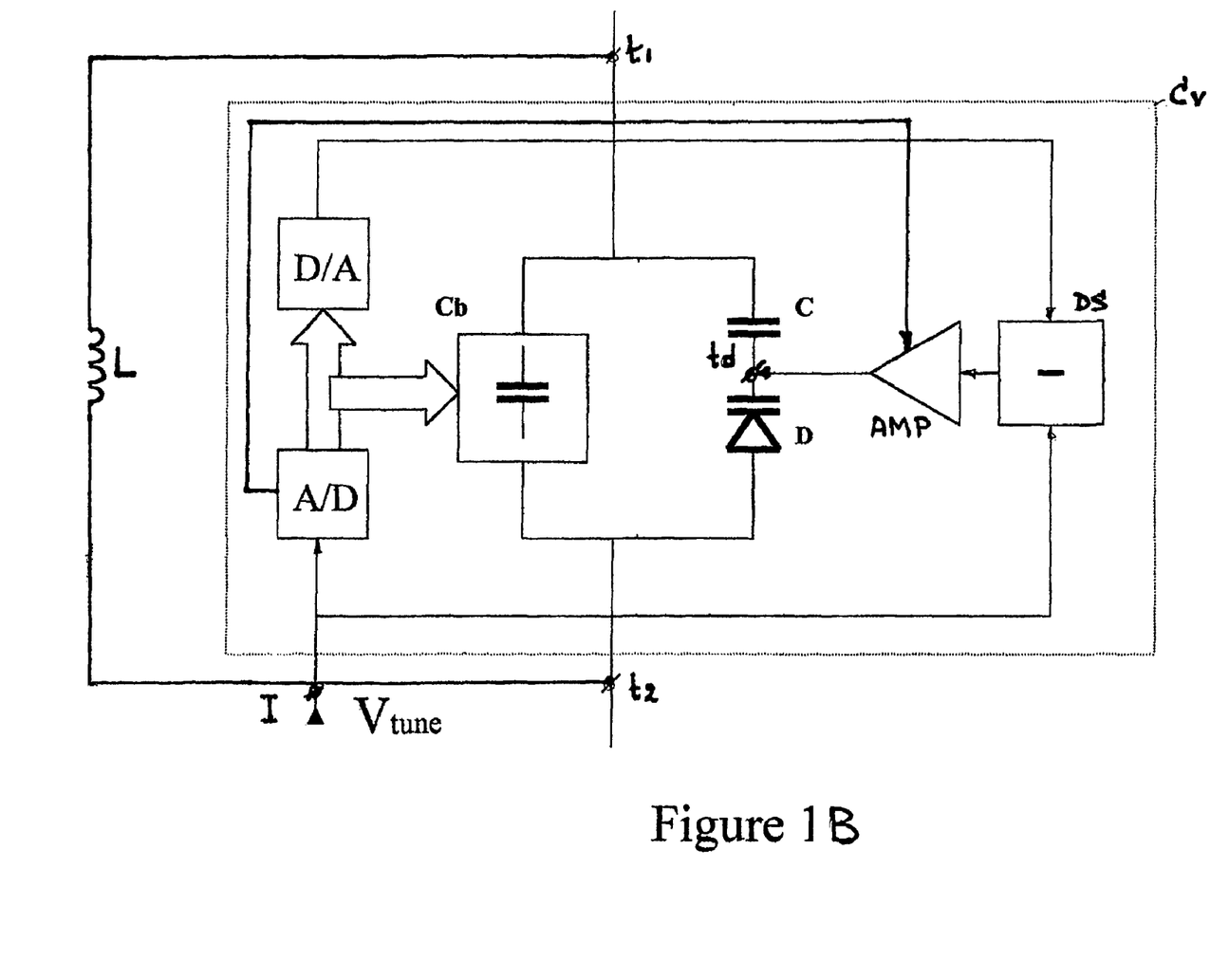
FIG. 1B is a block diagram of a first preferred embodiment of a variable capacitance device according to the invention as part of an LC circuit.
Figure 8:
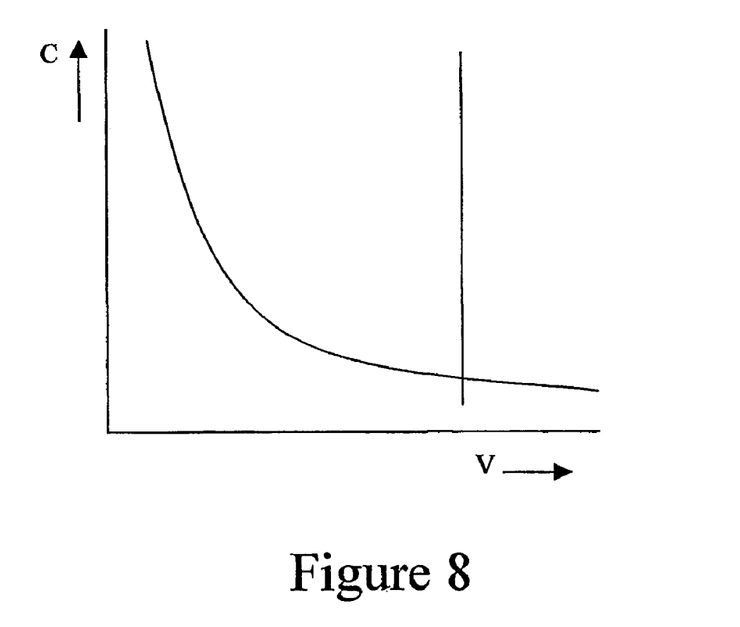
FIG. 8 a signal plot showing the capacitance versus voltage characteristic of a conventional variable capacitance diode.

FIG. 1B is a block diagram of a preferred embodiment of a variable capacitance device Cv according to the invention for use in a receiver in which elements corresponding to the elements shown in FIG. 1A are provided with same reference numerals. The variable capacitance device Cv comprises a capacitor bank Cb coupled between first and second terminals t1 and t2 and connected in parallel to an inductor L to form an LC tuning circuit. The variable capacitance device Cv comprises a control input I being supplied with a continuous control signal to vary the capacitance of Cv and therewith the tuning frequency of the LC tuning circuit, this control signal hereinafter also being referred to as tuning control signal Vtune. The control input I is coupled through an analogue to digital converter AD to a control input of a digitally controlled capacitor bank Cb as well as to a first input of a differential stage DS. An output of the analogue to digital converter AD is coupled through a digital to analogue converter DA to a second input of the differential stage DS. An output of the differential stage DS is coupled through amplification means AMP to a control terminal td of a variable capacitance diode D at the common connection between a serial arrangement of said variable capacitance diode D and a blocking capacitor C. This serial arrangement is coupled in parallel to the capacitor bank Cb between said between first and second terminals t1 and t2. The amplification means AMP amplifies the output signal of the differential stage DS, i.e. the mutual difference of the signals at the first and second input of said differential stage DS—hereinafter also being referred to as discretion difference—to adapt the same to the available capacitance variation range of the variable capacitance diode D. Furthermore by varying the gain of the amplification means AMP dependent on the tuning control voltage Vtune, a compensation of the non-linear tuning control voltage dependent capacitance variation of the diode D is obtained. As can be seen from the capacitance versus voltage characteristic of a conventional variable capacitance diode as shown in FIG. 8, the slope of said characteristic decreases strongly with an increasing tuning control voltage. By increasing the above gain of the amplification means AMP with an increasing tuning control voltage, the control of the capacitance of the diode D can be made more linear therewith increasing the control accuracy.

To provide a continuously varying capacitance value at a likewise varying tuning control voltage Vtune at the input I, the capacitance variation range of the variable capacitance diode D should at least correspond to the capacitance variation stepwidth of the capacitor bank Cb at an incremental change of the output signal of the AD converter. The capacitance variation range of the variable capacitance diode D is chosen in such a way that it covers safely, even in situations with the worst case process spread, the incremental capacitance variation stepwidth of the capacitor bank. However, to prevent the occurrence of glitching of the capacitance value of the capacitor bank when being varied, the capacitance variation range of the variable capacitance diode D is preferably chosen to be somewhat smaller, in practise approximately 10%) of the incremental capacitance variation stepwidth of the capacitor bank.

The variable capacitance device Cv according to the invention as a whole is very well suitable to be substituted for any single conventional variable capacitance diode and functions properly at supply voltages substantially lower than the supply voltage needed for such conventional variable capacitance diodes. This eliminates the need for DC-DC voltage converters in receivers with low bias voltage. In the absence of requirements to provide a continuously varying capacitance value at a likewise varying tuning control voltage, the use of a single capacitor bank, such as the capacitor bank Cb, as substitute for a conventional variable capacitance diode, may suffice. The variable capacitance device Cv according to the invention, however, fully meets said requirements, and its field of use includes all types of tuneable filters, whether or not being part of a tuning circuit and/or loop circuit, such as e.g. phase or frequency locked loops.

Figure 5:
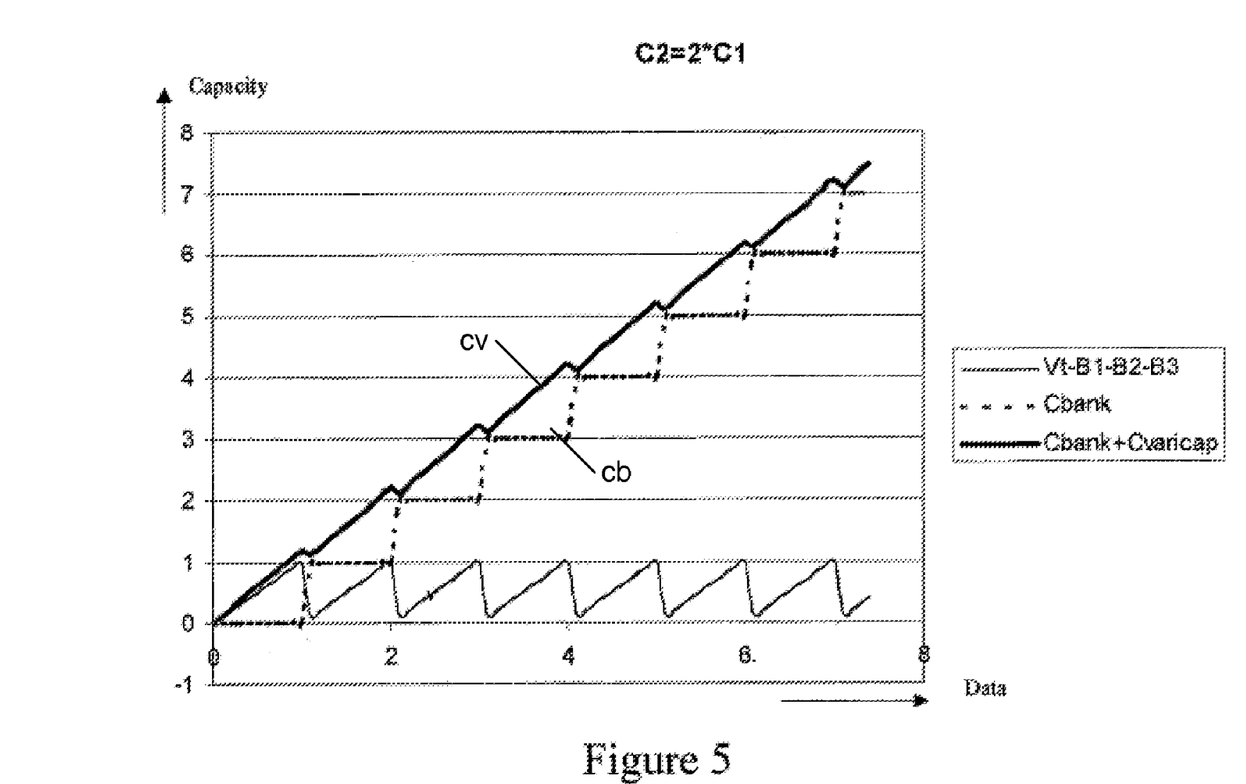
FIG. 5 is a signal plot showing the capacitance variation within a control range of an ideal capacitor bank having $2^3=8$ discrete capacitance value settings using 3 capacitors without spread.

The capacitance variation of the variable capacitance device Cv according to the invention as shown in FIG. 1B including an ideal capacitor bank with n=3 is given in FIG. 5. Such ideal capacitor bank includes 3 capacitors without spread and has $2^3=8$ discrete capacitance settings. The capacitance variation range of the diode D is chosen to correspond to the capacitance variation stepwidth of the capacitor bank at an incremental change of the output signal of the AD converter. Curve cb of FIG. 5 shows the capacitance of the ideal capacitor bank Cb, whereas curve cv of this FIG. 5 is showing the total capacitance of the variable capacitance device Cv. For each value of the tuning control input signal, the variable capacitance device Cv having an ideal capacitor bank Cb defines a certain capacitance value.

Figure 6:
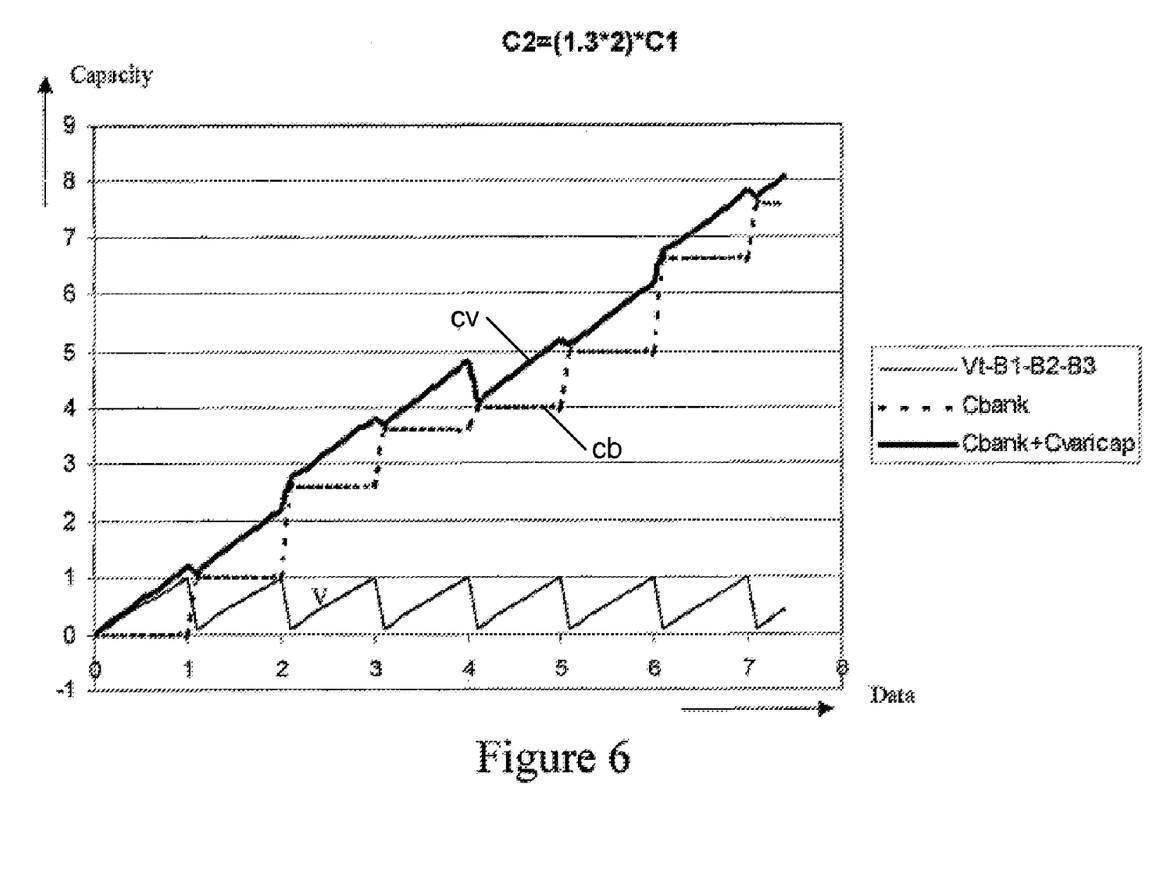
FIG. 6 is a signal plot showing the capacitance variation within a control range of a monolithically integrated digitally controlled capacitor bank having $2^3=8$ discrete capacitance value settings using first to third capacitors, the second capacitor having 30% spread.

The capacitance variation of a variable capacitance device Cv according to the invention as shown in FIG. 1B in a practical implementation in integrated form, including a non-ideal capacitor bank with n=3 is given in FIG. 6. This non-ideal capacitor bank has $2^3=8$ discrete capacitance settings and includes first to third capacitors C1-C3, in which C2=1.3*C1*2 and in which C3=4*C1. C2 shows a value spread of 30%. The capacitance variation range of the diode D is chosen to cover the capacitance variation stepwidth of the capacitor bank at an incremental change of the output signal of the AD converter. The capacitance variation range of the diode D therewith corresponds to the capacitance variation stepwidth of the capacitor bank at said incremental change of the output signal of the AD converter. Curve cb of this FIG. 6 shows the capacitance of the non-ideal capacitor bank Cb, whereas curve cv is showing the total capacitance of the variable capacitance device Cv. Also here the variable capacitance device Cv defines a capacitance value for each value of the tuning control input signal. This allows to use the variable capacitance device Cv according to the invention as shown in FIG. 1B in phase locked loops as will be explained in more detail with reference to FIG. 4.

Figure 7:
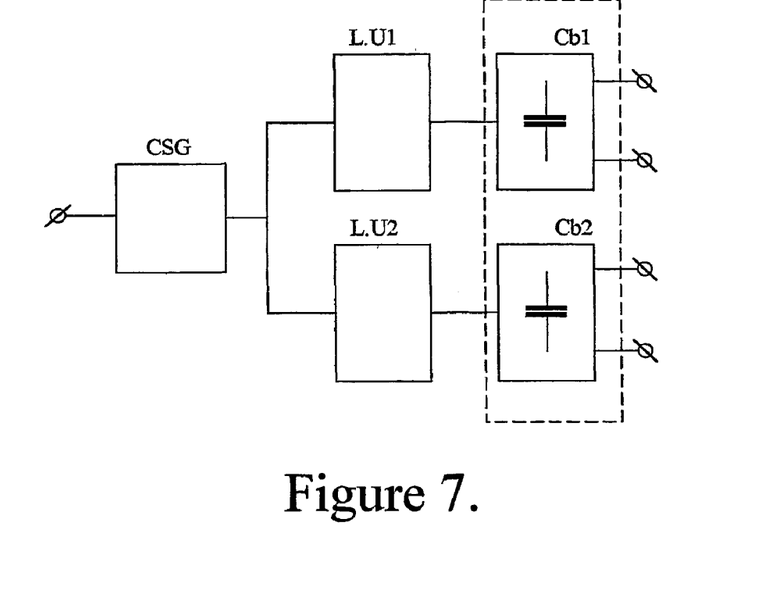
FIG. 7 a block diagram of a second preferred embodiment of a variable capacitance device according to the invention for use in tracked filters.

FIG. 7 shows a block diagram of a second preferred embodiment of a variable capacitance device according to the invention comprising a tuning control signal generator CSG being supplied with a tuning control signal. The tuning control signal can be a continuous signal, in which event the tuning control signal generator CSG includes an analogue to digital converter, or the tuning control signal can be a digital signal, in which event the tuning control signal generator CSG may comprise digital signal processing means and may eventually be dispensed with. The tuning control signal generator CSG supplies an m-bit digital tuning control voltage to inputs of first and second look up tables LU1 and LU2. These first and second look up tables LU1 and LU2 each comprise m*n storage locations for storing therein respective first and second n bit binary signals which are supplied to n capacitors of first and second capacitor banks Cb1 and Cb2, n being larger than m. The first and second capacitor banks Cb1 and Cb2 are monolithically implemented to reduce the absolute spread and may be commonly mounted in a single housing. The first and second look up tables include, apart from bit number conversion data also data providing parallel tracking of filters, in which the first and second capacitor banks Cb1 and Cb2 are used as tuneable capacitance devices. Dependent on the frequency difference between such tracked filters, parallel tracking may require the capacitance of the first capacitor bank Cb1 to vary at a exactly predictable (calculable), difference from the capacitance of the second capacitor bank Cb2 with a certain variation of the n-bit digital tuning control signal. This capacitance difference is to be taken into account in the generation of the first and second n-bit digital signals. The implementation thereof lies within the normal ability of a person skilled in the art and shall therefore not be described in further detail.

Figure 2:
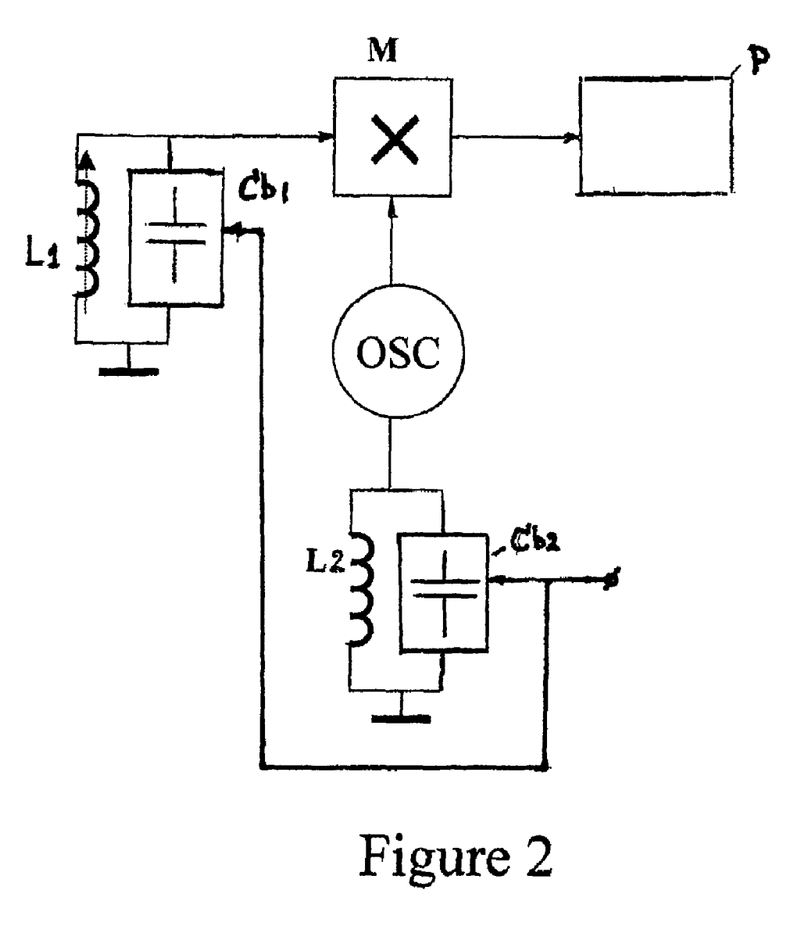
FIG. 2 is a block diagram of a first preferred embodiment of a receiver according to the invention.

An application of such a variable capacitance device in a first preferred embodiment of a receiver according to the invention is shown in FIG. 2. The receiver shown includes an RF input filter comprising a first parallel LC circuit L1Cb1, formed by an antenna ANT functioning as an inductor L1 and the above first variable capacitor bank Cb1. The RF input filter is coupled to a mixer stage M for converting an RF signal being selected by the RF input filter RF into an IF signal, which IF signal is being processed in known manner into audible signal in signal processing means P. The mixer stage M is supplied with a local oscillator signal being generated by a tuneable oscillator OSC comprising a second tuneable LC circuit L2Cb2 comprising an inductor L2 in parallel with the above second tuneable capacitor bank Cb2. The controllable capacitor banks Cb1 and Cb2 are being provided with first and second n-bit digital control signals from respectively said first and second look up tables LU1 and LU2. The frequency of the local oscillator OSC deviates over the IF frequency from the carrier frequency of the wanted RF signal. For a correct tuning to a wanted RF signal within the receiver tuning range, the second tuneable LC circuit L2Cb2 should track the first parallel LC circuit L1Cb1 within the receiver tuning range over a constant frequency difference corresponding to the IF frequency. This is achieved with a proper adaptation of the above first and second n-bit digital control signal for the first and second capacitor banks Cb1 and Cb2.

Figure 4:
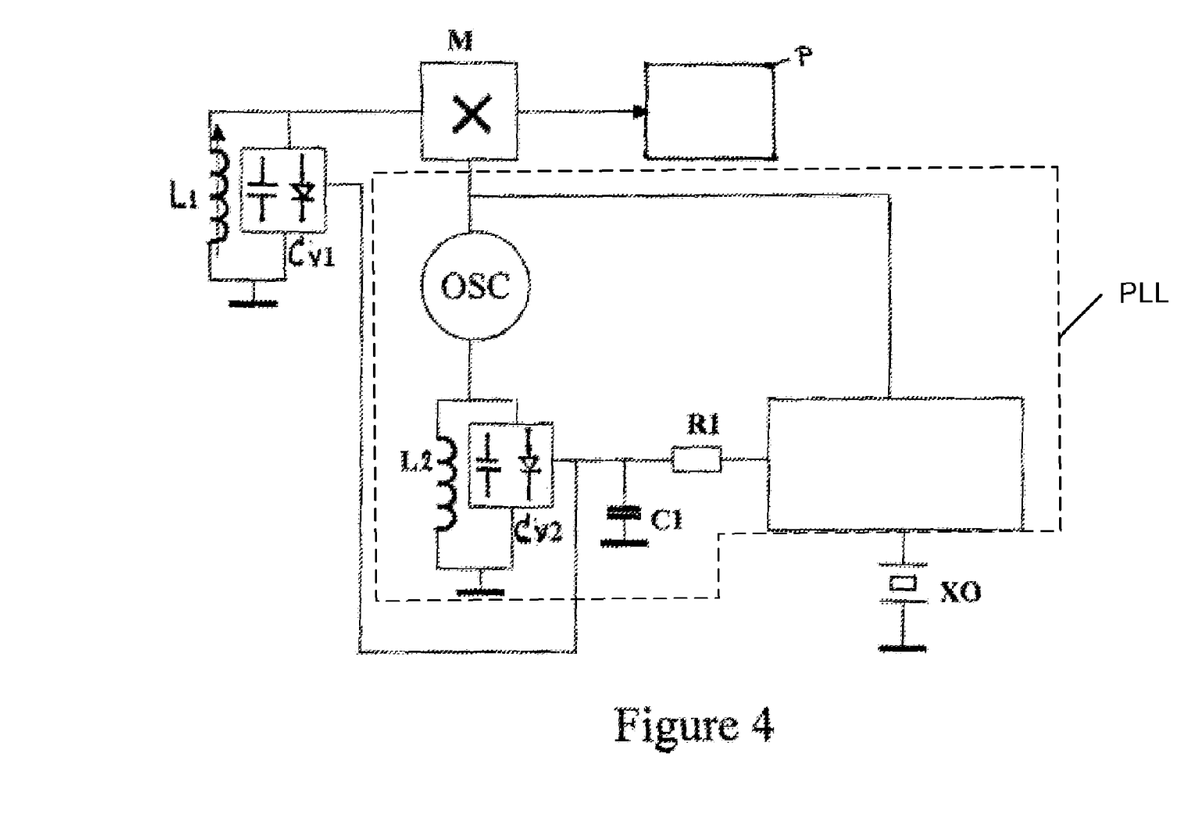
FIG. 4 is a block diagram of the front end of a second preferred embodiment of a receiver according to the invention using a PLL.

FIG. 4 shows an application of a variable capacitance device Cv as shown in FIG. 1B in an RF input filter and an LC tuning circuit of a second preferred embodiment of a receiver according to the invention. In contrast to the receiver of FIG. 2, the receiver shown here comprises a phase locked loop (PLL), which includes the tuneable local oscillator OSC. An output of the local oscillator OSC is compared with a reference frequency derived from the oscillation frequency of a crystal oscillator XO in a phase detector of the PLL. Such PLL functions properly only if within the LC tuning circuit a capacitance value is defined for each frequency within the tuning range. The absence of capacitance values, which may occur when using a capacitor bank only without a variable capacitance diode, may give rise to repeatedly switching of the capacitor bank between two capacitance settings.

The, LC RF input filter comprises a first parallel LC circuit L1Cv1, formed by an antenna ANT functioning as an inductor L1 and a first variable capacitance device Cv1 according to the invention. The RF input filter is coupled to a mixer stage M for converting an. RF signal being selected by the RF input filter RF into an IF signal, which IF signal is being processed in known manner into audible signal in signal processing means P. The mixer stage M is supplied with a local oscillator signal being generated by a tuneable oscillator OSC comprising a second tuneable LC circuit L2Cv2 comprising an inductor L2 in parallel with a second variable capacitance device Cv2 according to the invention. The first and second capacitor banks of the first and second variable capacitance device Cv1 respectively Cv2 include respectively first and second look up tables LU1 and LU2 (not shown). The frequency of the local oscillator OSC deviates over the IF frequency from the carrier frequency of the wanted RF signal. For a correct tuning to a wanted RF signal within the receiver tuning range, the second tuneable LC circuit L2Cv2 should track the first parallel LC circuit L1Cv1 within the receiver tuning range over a constant frequency difference corresponding to the IF frequency. This is achieved with a proper adaptation of the above first and second n-bit digital control signal for the first and second capacitor banks Cb1 and Cb2 of the first and second variable capacitance device Cv1 and Cv2 according to the invention.

Figure 3:
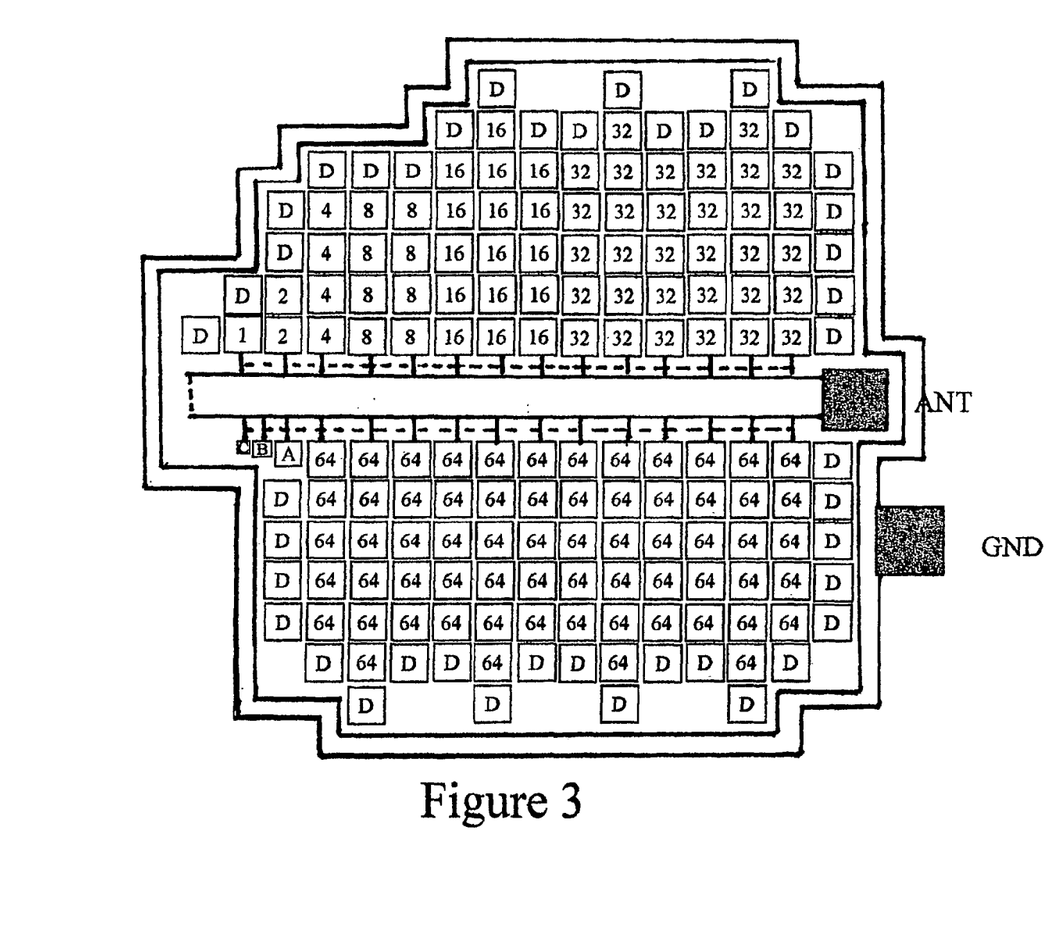
FIG. 3 is an IC lay out structure used in the implementation of the monolithically integrated digitally controlled capacitor bank of FIG. 1A.

FIG. 3 shows an IC lay out structure used in the implementation of the monolithically integrated digitally controlled capacitor bank of FIG. 1A and FIG. 1B with n capacitors forming a binary weighted sequence of values. The integrated n capacitors may be based on the use of oxyde layers or p-n junctions, both technologies being understood to be planary. The blocks indicated by numbers each represent a unity capacitor covering a unity IC surface. Among the n capacitors is a unity capacitor being indicated by a single block, identified with the reference numeral 1 and covering a single unity IC surface. Capacitors smaller than said unity capacitor 1 are being indicated by blocks A, B and C. These capacitors cover respective IC surfaces, which in proportion to their value are smaller than said unity IC surface, hereinafter also indicated as scaled capacitors. The capacitors greater than said unity capacitor are being formed by clusters of a binary weighted number of unity capacitors referred to by blocks with reference numerals: 2, 4, 8, 16, 32 and 64. The unity capacitors of the clusters are being surrounded by isolated dummy unity capacitors to provide for a compensation in the lack of neighbouring capacitors on the outer boundaries of the respective clusters, therewith obtaining a further minimisation in the relative spread of the various capacitors. Furthermore, the clusters are structured in lay out to minimise parasitic wiring effects.

In a practical embodiment the total spread in the capacitance value of the unity capacitor is 1%. Therewith all capacitors larger than the unity capacitor have a total spread in their capacitance value of 1%. Capacitors smaller than the unity capacitor, i.e. capacitors A-C, show a much larger procentual spread in their capacitance value, however, these capacitors are only used in combination with the unity capacitor and/or one or more capacitors larger than the unity capacitor. This minimises the effect of the larger spread in the capacitance value of said capacitors A-C on the overall capacitance of the capacitor bank at each value within the control or tuning range.

Preferably, the n capacitors of the capacitor bank are chosen to form a binary weighted sequence of capacitance values ranging from $2^0$ to $2^{n-1}$, whereas said unity capacitor is chosen to correspond to a capacitance value $2^k$, k being larger than 1 and smaller than n. In a practical embodiment, in which n was in the order of magnitude of 10, an appropriate low spread in the capacitance value of the capacitor bank within its control range is obtained with k being chosen in a range between 3 and 8.

The value of the unity capacitor may also be chosen to define together with the above Cfix the upper boundary limit of the tuning range.

The smallest capacitor C in the capacitor bank Cb of FIG. 3 is chosen to define the tuning stepwidth. In a practical embodiment the unity capacitor is chosen at a capacitance value of 13.6 pF and the smallest capacitor C of the capacitor bank at a capacitance value of 1.7 pF.

While the present invention has been illustrated and described with respect to some specific embodiments thereof, it is to be understood that the present invention is by no means limited thereto, but encompasses all changes and modifications which will become possible within the scope of the appended claims. It is therefore possible to also use the invention when applying the various measures according to the invention separately and mutually independent from each other. For example, it is very well possible to apply the measure to use of scaled capacitors in combination with clusters of unity capacitors, the measure to use a bitnumber conversion device and the measure to apply a variable capacitance diode in parallel to a capacitor bank separately or in any mutual combination, other than shown in the drawing.

The invention claimed is:

1. Receiver comprising
a tuning circuit that includes a digitally controlled capacitor bank with n capacitors monolithically integrated in planar form and controlled by a tuning control signal, the n capacitors providing various capacitance values, including a unity capacitor covering a unity IC surface, wherein:
capacitors of the n capacitors having capacitance values smaller than the unity capacitor cover respective IC surfaces, which in proportion to their value are smaller than the unity IC surface, and
capacitors of the n capacitors having capacitance values greater than the unity capacitor are formed by clusters of unity capacitors, each unity capacitor covering an IC surface corresponding to the unity IC surface.

2. Receiver according to claim 1, wherein
the n capacitors form a binary weighted sequence of capacitance values ranging from $2^0$ to $2^{n-1}$, the unity capacitor corresponds to a capacitance value $2^k$, and
k is larger than 1 and smaller than n.

3. Receiver according to claim 2, wherein
n is in the order of magnitude of 10 and
k is chosen in a range between 3 and 8.

4. Receiver according to claim 2, wherein
the unity capacitor is chosen to define an upper boundary limit of the tuning range.

5. Receiver according to claim 2, wherein
the clusters of unity capacitors are surrounded by isolated dummy capacitors.

6. Receiver according to claim 5, further including
an AD converter for converting an analogue tuning control signal into an m bit binary signal, and
a bitnumber conversion device, operably coupled to the AD converter for converting the m bit binary signal into an n bit binary signal, m being smaller than n, the n bit binary signal including N bits controlling the n capacitors of the capacitor bank.

7. Receiver according to claim 6, wherein
the bitnumber conversion device includes
a look up table that includes m*n storage locations for storing therein the n bit binary signal controlling the n capacitors of the capacitor bank as a function of them bit binary signal.

8. Receiver according to claim 6, wherein
the bitnumber conversion device includes
a microprocessor for executing an algorithm for converting an m bit binary signal into an n bit binary signal.

9. Receiver according to claim 8, further including
a calibration circuit, operably coupled to the bitnumber conversion device, for measuring absolute spread in the capacitance values of the n capacitors of the capacitor bank to adapt the bitnumber conversion device to compensate for the absolute spread.

10. Receiver according to claim 2, further including
an AD converter for converting an analogue tuning control signal into an m bit binary signal, and
a bitnumber conversion device, operably coupled to the AD converter for converting the m bit binary signal into an n bit binary signal, m being smaller than n, the n bit binary signal including N bits controlling the n capacitors of the capacitor bank.

11. Receiver according to claim 2, further including
an RF input filter that includes a further capacitor bank that is controlled by a control signal generator to provide parallel tracking of the tuning circuit and the RF filter.

12. Receiver according to claim 1, wherein
the clusters of unity capacitors are surrounded by isolated dummy capacitors.

13. Receiver according to claim 12, further including
an RF input filter that includes a further capacitor bank that is controlled by a control signal generator to provide parallel tracking of the tuning circuit and the RF filter.

14. Receiver according to claim 1, including:
an AD converter for converting an analogue tuning control signal into an m bit binary signal, and
a bitnumber conversion device, operably coupled to the AD converter for converting the m bit binary signal into an n bit binary signal, m being smaller than n,
the n bit binary signal including N bits controlling then capacitors of the capacitor bank.

15. Receiver according to claim 14, wherein
the bitnumber conversion device includes
a look up table that includes m*n storage locations for storing therein the n bit binary signal controlling the n capacitors of the capacitor bank as a function of them bit binary signal.

16. Receiver according to claim 14, wherein
the bitnumber conversion device includes
a microprocessor for executing an algorithm for converting an m bit binary signal into an n bit binary signal.

17. Receiver according to claim 14, including
a calibration circuit, operably coupled to the bitnumber conversion device, for measuring absolute spread in the capacitance values of the n capacitors of the capacitor bank to adapt the bitnumber conversion device to compensate for the absolute spread.

18. Receiver according to claim 1, including
an RF input filter that includes a further capacitor bank that is controlled by a control signal generator to provide parallel tracking of the tuning circuit and the RF filter.

19. Variable capacitance device comprising
a digitally controlled capacitor bank with n capacitors that is monolithically integrated in planar form and is controlled by a control signal for varying the capacitance of the capacitor bank,
wherein
the n capacitors provides various capacitance values including a unity capacitor covering a unity IC surface,
wherein capacitors of the n capacitors having capacitance values smaller than the unity capacitor cover respective IC surfaces, which in proportion to their value are smaller than the unity IC surface and
wherein capacitors of the n capacitors having capacitance values greater than the unity capacitor are formed by clusters of unity capacitors, each unity capacitor covering an IC surface corresponding to the unity IC surface.

20. Variable capacitance device according to claim 19, wherein:
the n capacitors form a binary weighted sequence of capacitance values ranging from $2^0$ to $2^{-n\ 1}$,
the unity capacitor corresponds to a capacitance value $2^k$, and
k is larger than 1 and smaller than n.

21. Variable capacitance device according to claim 20, wherein
n is in the order of magnitude of 10 and
k is in a range between 3 and 8.

22. Variable capacitance device according to claim 20, wherein
the unity capacitor is chosen to define an upper boundary limit of the control range.

23. Variable capacitance device according to claim 20, wherein
the clusters of unity capacitors are surrounded by isolated dummy capacitors.

24. Variable capacitance device according to claim 20, further including
an AD converter for converting an analogue control signal into an m bit binary signal, and
a bitnumber conversion device, operably coupled to the AD converter for converting the m bit binary signal into an n bit binary signal;
m being smaller than n, and
the n bit binary signal including N bits controlling the n capacitors of the capacitor bank.

25. Variable capacitance device according to claim 24, wherein
the bitnumber conversion device includes a look up table that includes m*n storage locations for storing therein the n bit binary signal controlling the n capacitors of the capacitor bank as a function of them bit binary signal.

26. Variable capacitance device according to claim 25, further including
a calibration circuit for measuring absolute spread in the capacitance values of the n capacitors of the capacitor bank, operably coupled to the bitnumber conversion device, to adapt the conversion to compensate for the absolute spread.

27. Variable capacitance device according to claim 24, wherein
the bitnumber conversion device includes a microprocessor for executing an algorithm for converting an m bit binary signal into an n bit binary signal.

28. Variable capacitance device according to claim 27, further including
a calibration circuit for measuring absolute spread in the capacitance values of the n capacitors of the capacitor bank, operably coupled to the bitnumber conversion device, to adapt the conversion to compensate for the absolute spread.

29. Variable capacitance device according to claim 24, further including
a calibration circuit for measuring absolute spread in the capacitance values of the n capacitors of the capacitor bank, operably coupled to the bitnumber conversion device, to adapt the conversion to compensate for the absolute spread.

30. Variable capacitance device according to claim 19, wherein
the clusters of unity capacitors are surrounded by isolated dummy capacitors.

31. Variable capacitance device according to claim 19, including:
an AD converter for converting an analogue control signal into an m bit binary signal, and
a bitnumber conversion device, operably coupled to the AD converter, for converting the m bit binary signal into an n bit binary signal,
m being smaller than n, and
the n bit binary signal including N bits controlling then capacitors of the capacitor bank.

32. Variable capacitance device according to claim 31, wherein
the bitnumber conversion device includes a look up table that includes m*n storage locations for storing therein the n bit binary signal controlling the n capacitors of the capacitor bank as a function of them bit binary signal.

33. Variable capacitance device according to claim 32, further including
a calibration circuit for measuring absolute spread in the capacitance values of the n capacitors of the capacitor bank, operably coupled to the bitnumber conversion device, to adapt the conversion to compensate for the absolute spread.

34. Variable capacitance device according to claim 31, wherein
the bitnumber conversion device includes a microprocessor for executing an algorithm for converting an m bit binary signal into an n bit binary signal.

35. Variable capacitance device according to claim 34, further including
a calibration circuit for measuring absolute spread in the capacitance values of the n capacitors of the capacitor bank, operably coupled to the bitnumber conversion device, to adapt the conversion to compensate for the absolute spread.

36. Variable capacitance device according to claim 31, including
a calibration circuit for measuring absolute spread in the capacitance values of then capacitors of the capacitor bank, operably coupled to the bitnumber conversion device, to adapt the conversion to compensate for the absolute spread.

37. Variable capacitance device according to claim 36, including, in a common housing:
first and second look up tables,
wherein:
a common input of the first and second look up tables is supplied with a control signal and
outputs of the first and second look up tables are coupled to first and second monolithically integrated digitally controlled capacitor banks for the use thereof in first and second filter circuits, respectively, and
the first and second look up tables provide for parallel filter tracking.

* * * * *